(12) United States Patent
Ridgeway et al.

(10) Patent No.: US 11,158,498 B2
(45) Date of Patent: Oct. 26, 2021

(54) SILICON COMPOUNDS AND METHODS FOR DEPOSITING FILMS USING SAME

(71) Applicant: Versum Materials US, LLC, Tempe, AZ (US)

(72) Inventors: Robert G. Ridgeway, Tempe, AZ (US); Jennifer Lynn Anne Achtyl, Tempe, AZ (US); Raymond N. Vrtis, Tempe, AZ (US); Xinjian Lei, Tempe, AZ (US); William Robert Entley, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 23 days.

(21) Appl. No.: 16/443,978

(22) Filed: Jun. 18, 2019

(65) Prior Publication Data

US 2019/0385840 A1  Dec. 19, 2019

Related U.S. Application Data

(60) Provisional application No. 62/687,050, filed on Jun. 19, 2018.

(51) Int. Cl.
| | | |
|---|---|---|
| *H01L 21/02* | (2006.01) | |
| *C23C 16/56* | (2006.01) | |
| *C23C 16/50* | (2006.01) | |
| *C07F 7/08* | (2006.01) | |

(52) U.S. Cl.
CPC ...... *H01L 21/02211* (2013.01); *C07F 7/0834* (2013.01); *C23C 16/50* (2013.01); *C23C 16/56* (2013.01); *H01L 21/02164* (2013.01); *H01L 21/02274* (2013.01); *H01L 21/02348* (2013.01); *H01L 21/02351* (2013.01)

(58) Field of Classification Search
CPC ........ B05D 1/60; B05D 3/067; B05D 3/0254; B05D 1/62; H01L 21/02203; H01L 21/02216; H01L 21/02126; H01L 21/02348; H01L 21/02274; C23C 16/30; C23C 16/50; C23C 16/56; C23C 16/401; H01B 3/46
See application file for complete search history.

(56) References Cited

U.S. PATENT DOCUMENTS

| | | | | |
|---|---|---|---|---|
| 6,231,989 B1* | 5/2001 | Chung | ................ | C04B 41/5035 428/447 |
| 2004/0048960 A1* | 3/2004 | Peterson | ........... | H01L 21/02282 524/261 |
| 2006/0222869 A1* | 10/2006 | Cai | ........................ | B82Y 30/00 428/447 |
| 2010/0022792 A1* | 1/2010 | Shen | ..................... | C07F 7/0807 556/431 |
| 2015/0364321 A1* | 12/2015 | Vrtis | ..................... | C07F 7/0807 556/431 |

OTHER PUBLICATIONS

Moore, "Mechanical Characterization of low-K dielectric materials", AIP Conference Proceedings 550, 431 (2001); https://doi.org/10.1063/1.1354437 Published Online: Mar. 28, 2001 (Year: 2001).*

* cited by examiner

*Primary Examiner* — Michael P Wieczorek
*Assistant Examiner* — Michael G Miller
(74) *Attorney, Agent, or Firm* — David K. Benson

(57) ABSTRACT

A chemical vapor deposition method for producing a dielectric film, the method comprising: providing a substrate into a reaction chamber; introducing gaseous reagents into the reaction chamber wherein the gaseous reagents comprise a silicon precursor comprising an silicon compound having Formula I as defined herein and applying energy to the gaseous reagents in the reaction chamber to induce reaction of the gaseous reagents to deposit a film on the substrate. The film as deposited is suitable for its intended use without an optional additional cure step applied to the as-deposited film.

17 Claims, No Drawings

SILICON COMPOUNDS AND METHODS FOR DEPOSITING FILMS USING SAME

This application claims priority to U.S. Provisional Application 62/687,050, filed Jun. 19, 2018, which is incorporated herein by reference in its entirety.

BACKGROUND

Described herein are compositions and methods for the formation of dielectric films using alkoxysilacyclic or acyloxysilacyclic compounds as a structure forming precursor(s). More specifically, described herein are compositions and methods for forming low dielectric constant ("low k" film or film having a dielectric constant of about 3.2 or less) films, wherein the method used to deposit the film is a chemical vapor deposition (CVD) method. The low dielectric films produced by the compositions and methods described herein can be used, for example, as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants ranging from about 2.7 to about 3.5. This organosilica glass is typically deposited as a dense film (density~1.5 g/cm$^3$) from an organosilicon precursor, such as a methylsilane or siloxane, and an oxidant, such as $O_2$ or $N_2O$. Organosilica glass will be herein be referred to as OSG. As the carbon content of OSG increases, the mechanical strength of the films, such as Hardness (H) and Elastic Modulus (EM) of the films, tend to decrease rapidly as the dielectric constant is reduced.

A challenge recognized in the industry is that films with lower dielectric constants typically have lower mechanical strength, which leads to enhanced defects in the narrow pitch films such as delamination, buckling, and increased electromigration such as that observed for conductive lines made from copper embedded in dielectric films with reduced mechanical properties. Such defects can cause premature breakdown of the dielectric or voiding of the conductive copper lines causing premature device failure. Carbon depletion in the OSG films can also cause one or more of the following problems: an increase in the dielectric constant of the film; film etching and feature bowing during wet cleaning steps; moisture absorption into the film due to loss of hydrophobicity; and pattern collapse of fine features during the wet clean steps after pattern etch and/or integration issues when depositing subsequent layers such as, without limitation, copper diffusion barriers, for example Ta/TaN or advanced Co or MnN barrier layers.

Possible solutions to one or more of these problems are to use porous OSG films with increased carbon content but that maintains mechanical strength. Unfortunately, the relationship between increasing Si-Me content typically leads to decreasing mechanical properties, thus the films with more Si-Me will negatively impact mechanical strength which is important for integration.

One solution proposed has been to use ethylene or methylene bridged alkoxysilanes of the general formula $R_x(RO)_{3-x}Si(CH_2)_ySiR_z(OR)_{3-z}$ where x=0-3, y=1 or 2, z=0-3. The use of bridged species is believed to avoid the negative impact to the mechanical by replacing bridging oxygen with a bridging carbon chain since the network connectivity will remain the same. This arises from the belief that replacing bridging oxygen with a terminal methyl group will lower mechanical strength by lowering network connectivity. In this manner one, can replace an oxygen atom with 1-2 carbon atoms to increase the atomic weight percent (%) C without lowering mechanical strength. These bridged precursors, however, generally have very high boiling points due to the increased molecular weight from having two silicon groups. The increased boiling point may negatively impact the manufacturing process by making it difficult to deliver the chemical precursor into the reaction chamber as a gas phase reagent without condensing it in the vapor delivery line or process pump exhaust.

Thus, there is a need in the art for a dielectric precursor that provides a film with increased carbon content upon deposition, yet does not suffer the above-mentioned drawbacks.

BRIEF SUMMARY

The method and composition described herein fulfill one or more needs described above. The method and composition described herein use silicon compound(s) such as, for example, 1,1-dimethoxysilacyclopentane (DESCP) or 1,1-diethoxysilacyclopentane (DMSCP), as the silicon precursor which can be used as deposited to provide a low-k interlayer dielectric, or can be subsequently treated with thermal, plasma or UV energy sources to change the film properties to for example provide chemical crosslinking to enhance mechanical strength. Further the films deposited using the silicon compounds described herein as the silicon precursor(s) comprise a relatively higher amount of carbon. In addition, the silicon compound(s) described herein have a lower molecular weight (Mw) relative to other prior art silicon precursors such as bridged precursors, (e.g., alkoxysilaneprecursors) which by nature of having 2 silicon groups have a higher MW and higher boiling points, thereby making the silicon precursors having boiling points 250° C. or less, more preferably 200° C. or less described herein more convenient to process, for example, in a high volume manufacturing process.

Described herein is a single precursor-based dielectric film comprising: a material represented by the formula $Si_vO_wC_xH_yF_z$, where v+w+x+y+z=100%, v is from 10 to 35 atomic %, w is from 10 to 65 atomic %, x is from 5 to 45 atomic %, y is from 10 to 50 atomic % and z is from 0 to 15 atomic %, wherein the film has pores with a volume porosity of 0 to 30.0%, a dielectric constant of 2.3 to 3.2 and mechanical properties such as hardness of 1.0 to 7.0 Gigapascals (GPa) and elastic modulus of 4.0 to 40.0 GPa. In certain embodiments, the film comprises a higher carbon content (10-40%) as measured by X-ray photospectrometry (XPS) and exhibits a decreased depth of carbon removal when exposed to, for example an $O_2$ or $NH_3$ plasma as measured by examining the carbon content determined by XPS depth profiling.

In one aspect, there is provided a chemical vapor deposition method for producing a dielectric film, comprising: providing a substrate into a reaction chamber; introducing gaseous reagents into the reaction chamber wherein the gaseous reagents comprise a silicon precursor comprising an silicon compound having the structure of Formula I:

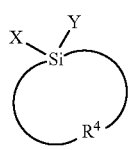
(I)

wherein X and Y are independently selected from the group consisting of $OR^1$, $OR^2$, and $OC(O)R^3$; $R^{1-3}$ are independently selected from the group consisting of a linear or branched $C_1$ to $C_{10}$ alkyl group, a linear or branched $O_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ heterocyclic alkyl group, a $C_5$ to $C_{10}$ aryl group, and a $C_3$ to $C_{10}$ hetero-aryl group; and $R^4$ is a $C_3$ to $C_5$ alkyl di-radical which forms a four-membered, five-membered, or six-membered saturated cyclic ring with the Si atom, and optionally at least one oxygen source; and applying energy to the gaseous reagents in the reaction chamber to induce reaction of the gaseous reagents to deposit a film on the substrate. The film as deposited is able to be used without additional treatment as although additional treatment may be used, for example, thermal annealing, plasma exposure or UV curing.

In another aspect, there is provided a chemical vapor deposition or plasma enhanced chemical vapor deposition method for producing a low k dielectric film, comprising: providing a substrate into a reaction chamber; introducing gaseous reagents into the reaction chamber wherein the gaseous reagents comprise optionally at least one oxygen source and a silicon precursor comprising an alkoxysilacyclic or acyloxysilacyclic compound having the following Formula I:

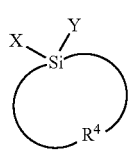
(I)

wherein X and Y are independently selected from the group consisting of $OR^1$, $OR^2$, and $OC(O)R^3$; $R^{1-3}$ are independently selected from the group consisting of a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ heterocyclic alkyl group, a $C_5$ to $C_{10}$ aryl group, and a $C_3$ to $C_{10}$ hetero-aryl group; and $R^4$ is a $C_3$ to $C_5$ alkyl di-radical which forms a four-membered, five-membered, or six-membered saturated cyclic ring with the Si atom; and applying energy to the gaseous reagents in the reaction chamber to induce reaction of the gaseous reagents to deposit a film on the substrate. Optionally, the method includes an additional step of applying energy to the deposited film wherein the additional energy is selected from the group consisting of thermal annealing, plasma exposure, and UV curing, wherein the additional energy alters the chemical bonding thereby enhancing the mechanical properties of the film. Silicon-containing films deposited according to the method disclosed herein typically have a dielectric constant of less than 3.4. In certain embodiments, the silicon precursor further comprises a hardening additive.

DETAILED DESCRIPTION

Described herein is a chemical vapor deposition method for producing a dielectric film, comprising: providing a substrate into a reaction chamber; introducing gaseous reagents into the reaction chamber wherein the gaseous reagents comprise a silicon precursor comprising an silicon compound having the structure of Formula I:

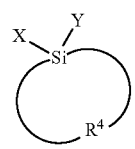
(I)

wherein X and Y are independently selected from the group consisting of $OR^1$, $OR^2$, and $OC(O)R^3$; $R^{1-3}$ are independently selected from the group consisting of a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ heterocyclic alkyl group, a $C_5$ to $C_{10}$ aryl group, and a $C_3$ to $C_{10}$ hetero-aryl group; and $R^4$ is a $C_3$ to $C_5$ alkyl di-radical which forms a four-membered, five-membered, or six-membered saturated cyclic ring with the Si atom, and optionally at least one oxygen source; and applying energy to the gaseous reagents in the reaction chamber to induce reaction of the gaseous reagents to deposit a film on the substrate. The film can be used as deposited or can be subsequently treated with additional energy selected from the group consisting of thermal energy (anneal), plasma exposure, and UV curing to modify the films chemical properties by increasing the films mechanical strength and yielding a dielectric constant less than 3.4.

The alkoxysilacyclic or acyloxysilacyclic compounds described herein provide unique attributes that make it possible for one to incorporate more carbon content in the dielectric film with minor impact on the mechanical properties of the low k dielectric film compared to prior art structure forming precursors such as diethoxymethylsilane (DEMS). For example, DEMS provides a mixed ligand system in DEMS with two alkoxy groups, one silicon-methyl (Si-Me) and one silicon-hydride which offers a balance of reactive sites and allows for the formation of more mechanically robust films while retaining the desired dielectric constant. The use of the alkoxysilacyclic or acyloxysilacyclic compounds offer the advantages that there are no silicon-methyl groups in the precursor which tends to lower the mechanical strength, while the carbon in the silacyclic ring provides carbon to the OSG film to lower the dielectric constant and imbue hydrophobicity.

The low k dielectric films are organosilica glass ("OSG") films or materials. Organosilicates are candidates for low k materials. Since the type of organosilicon precursor has a strong effect upon the film structure and composition, it is beneficial to use precursors that provide the required film properties to ensure that the addition of the needed amount of carbon to reach the desired dielectric constant does not produce films that are mechanically unsound. The method and composition described herein provides the means to generate low k dielectric films that have a desirable balance of electrical and mechanical properties as well as other beneficial film properties as high carbon content to provide improved integration plasma damage resistance.

In certain embodiments of the method and composition described herein, a layer of silicon-containing dielectric material is deposited on at a least a portion of a substrate via a chemical vapor deposition (CVD) or plasma enhanced chemical vapor deposition (PECVD). Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

In certain embodiments, the layer of silicon-containing dielectric material is deposited on at least a portion of the substrate by introducing into a reaction chamber gaseous reagents including at least one silicon precursor comprising a silicon compound without a porogen precursor. In another embodiments, the layer of silicon-containing dielectric material is deposited on at least a portion of the substrate by introducing into the reaction chamber gaseous reagents including at least one silicon precursor comprising an alkoxysilacyclic or acyloxysilacyclic compound with a hardening additive.

The method and composition described herein use an silicon compound having the following Formula I:

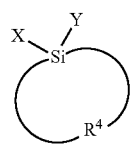

(I)

wherein X and Y are independently selected from the group consisting of $OR^1$, $OR^2$, and $OC(O)R^3$ wherein $R^{1-3}$ are independently selected from the group consisting of a linear or branched $C_1$ to $C_{10}$ alkyl group, a linear or branched $O_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^4$ is a $C_3$ to $C_5$ alkyl di-radical which forms a four-membered, five-membered, or six-membered saturated cyclic ring with the Si atom.

In the formula above and throughout the description, the term "alkyl" denotes a linear or branched functional group having from 1 to 10 carbon atoms. Exemplary linear alkyl groups include, but are not limited to, methyl, ethyl, n-propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group such as methoxy, ethoxy, iso-propoxy, and n-propoxy, a dialkylamino group such as dimethylamino or combinations thereof, attached thereto. In other embodiments, the alkyl group does not have one or more functional groups attached thereto. The alkyl group may be saturated or, alternatively, unsaturated.

In Formula I above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In Formula I above and throughout the description, the term "hetero-cyclic" denotes a $C_3$ to $C_{10}$ hetero-cyclic alkyl group such as an epoxy group.

In Formula I above and throughout the description, the term "alkenyl group" denotes a group which has one or more carbon-carbon double bonds and has from 2 to 10 or from 2 to 10 or from 2 to 6 carbon atoms.

In Formula I above and throughout the description, the term "alkynyl group" denotes a group which has one or more carbon-carbon triple bonds and has from 3 to 10 or from 2 to 10 or from 2 to 6 carbon atoms.

In Formula I above and throughout the description, the term "aryl" denotes an aromatic cyclic functional group having from 5 to 10 carbon atoms, or from 6 to 10 carbon atoms. Exemplary aryl groups include, but are not limited to, phenyl, benzyl, chlorobenzyl, tolyl, and o-xylyl.

In Formula I above and throughout the description, the term "hetero-aryl" denotes a $C_3$ to $C_{10}$ hetero-cyclic aryl group 1,2,3-triazolyl, pyrrrolyl, and furanyl.

In Formula I above, substituent $R^4$ is a $C_3$ to $C_{10}$ alkyl di-radical which forms a four-membered, five-membered, or six-membered cyclic ring with the Si atom. As the skilled person will understand, $R^4$ is a substituted or unsubstituted hydrocarbon chain which links with the Si atom together to form a ring in Formula I wherein the ring is a four-membered, five-membered, or six-membered ring. In these embodiments, the ring structure can be saturated ring such as, for example, a cyclic alkyl ring. Exemplary saturated rings include, but are not limited to, silacyclobutane, silacyclopentane, and silacyclohexane, preferably silacyclopentane or alkyl such as methyl substituted silacylcopentane.

Throughout the description, the term "alkoxysilacyclic" refers a compound having at least one Si-alkoxy group and one cyclic ring having one silicon atom and no carbon-carbon double bonds.

Throughout the description, the term "acyloxysilacyclic" refers a compound having at least one Si-acyloxy group and one cyclic ring having one silicon atom and no carbon-carbon double bonds.

Throughout the description, the term "oxygen source" refers to a gas comprising oxygen ($O_2$), a mixture of oxygen and helium, a mixture of oxygen and argon, carbon dioxide, carbon monoxide and combination thereof.

Throughout the description, the term "dielectric film" refers a film comprising silicon and oxygen atoms having composition of $Si_vO_wC_xH_yF_z$, where v+w+x+y+z=100%, v is from 10 to 35 atomic %, w is from 10 to 65 atomic %, x is from 5 to 40 atomic %, y is from 10 to 50 atomic % and z is from 0 to 15 atomic %.

In certain embodiments of Formula I, $R^1$ is selected from the group consisting of hydrogen, methyl, and ethyl, $R^2$ is selected from the group consisting of methyl, ethyl, and isopropyl, and $R^4$ forms a four-membered, five-membered, or six-membered saturated cyclic ring with the Si atom. In some embodiments, the four-membered, five-membered, or six-membered saturated cyclic ring with the Si atom may have at least one alkyl substituent such as a methyl group on the ring structure. Examples of these embodiments are as follows:

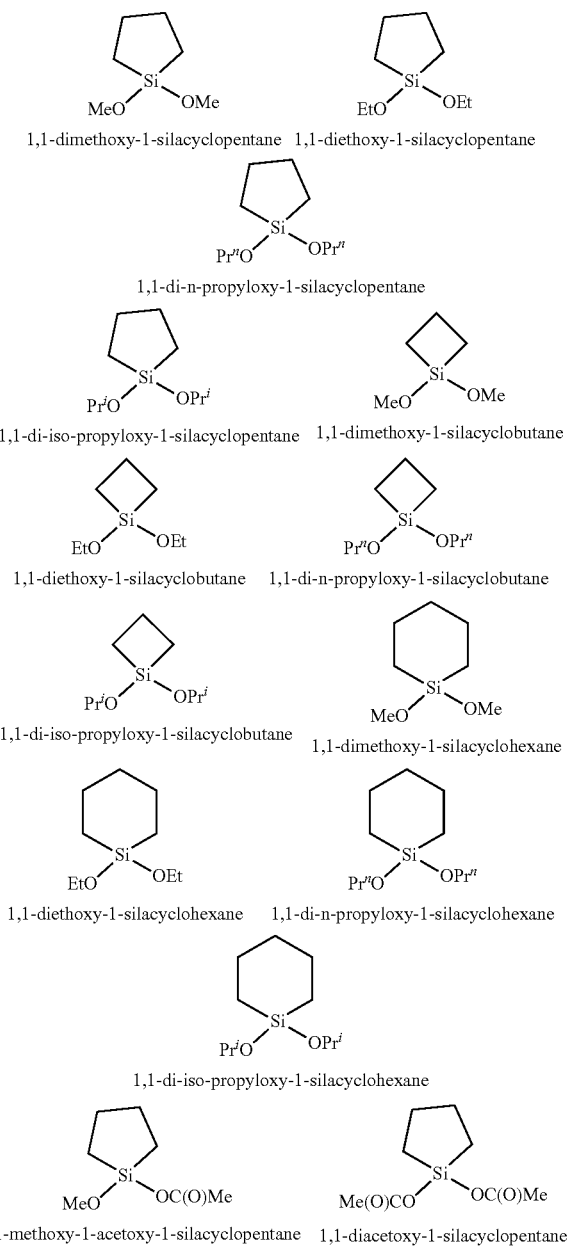

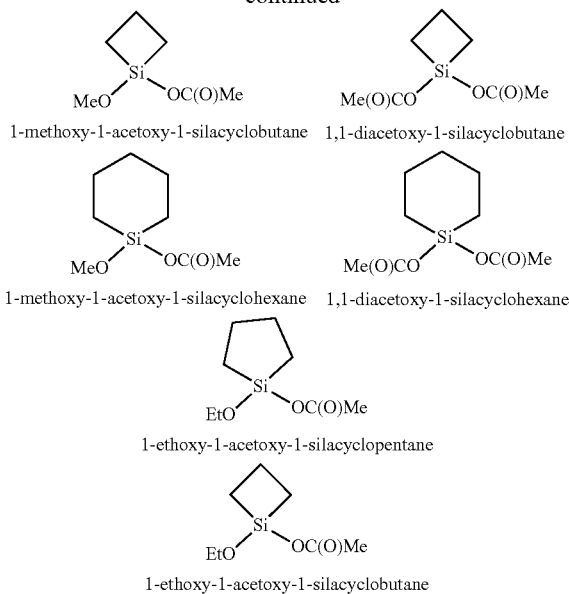

In some embodiments, the compositions and methods described herein employ the alkoxysilacyclic or acyloxysilacyclic compound, 1,1-dimethoxysilacyclopentane (DMSCP) or 1,1-diethoxysilacyclopentane (DESCP) or 1,1-diacetoxy-1-silacyclopentane, as the silicon precursor which has the following structure:

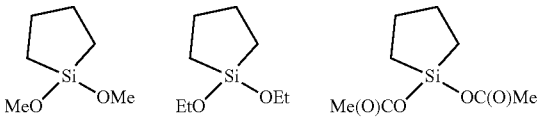

The silicon compounds described herein and methods and compositions comprising same are preferably substantially free of one or more impurities such as without limitation, halide ions and water. As used herein, the term "substantially free" as it relates to each impurity means 100 parts per million (ppm) or less, 50 ppm or less, 10 ppm or less, and 5 ppm or less, 1 ppm of less of each impurities such as without limitation, chloride or water.

In some embodiments, the alkoxysilacyclic or acyloxysilacyclic compounds disclosed herein are substantially free of or are free of halide ions (or halides) such as, for example, chlorides and fluorides, bromides, and iodides. As used herein, the term "substantially free of" means 100 parts per million (ppm) or less, 50 ppm or less, 10 ppm or less, 5 ppm or less, 1 ppm or less of the halide impurity. As used herein, the term "free of" means 0 ppm of the halide. Chlorides, for example, are known to act as decomposition catalysts for alkoxysilacyclic or acyloxysilacyclic compounds as well as potential contaminates that are detrimental to the performance of the produced electronic device. The gradual degradation of the alkoxysilacyclic or acyloxysilacyclic compounds may directly impact the film deposition process making it difficult for the semiconductor manufacturer to meet film specifications. In addition, the shelf-life or stability is negatively impacted by the higher degradation rate of the silicon compounds thereby making it difficult to guarantee a 1-2 year shelf-life. Therefore, the accelerated decomposition of the alkoxysilacyclic or acyloxysilacyclic compounds presents safety and performance concerns related to the formation of these flammable and/or pyrophoric gaseous byproducts. The silicon compounds are also preferably substantially free of metal ions such as, $Al^{3+}$ ions, $Fe^{2+}$, $Fe^{3+}$, $Ni^{2+}$, $Cr^{3+}$. As used herein, the term "substantially free" as it relates to $Al^{3+}$ ions, $Fe^{2+}$, $Fe^{3+}$, $Ni^{2+}$, $Cr^{2+}$ means less than 5 ppm (by weight), preferably less than 3 ppm, and more preferably less than 1 ppm, and most preferably 0.1 ppm.

Compositions disclosed herein that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodislanes, bromodisilanes, or iododislanes thereby avoiding the production of byproducts that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to, purification processes such as distillation, or adsorption. Distillation is commonly used to separate impurities from the desired product by exploiting differences in boiling point. Adsorption may also be used to take advantage of the differential adsorptive properties of the components to effect separation such that the final product is substantially free of halide. Adsorbents such as, for example, commercially available $MgO-Al_2O_3$ blends can be used to remove halides such as chloride.

Whereas prior art silicon-containing silicon precursors such as, for example DEMS, polymerize once energized in the reaction chamber to form a structure having an —O— linkage (e.g., —Si—O—Si— or —Si—O—C—) in the polymer backbone, it is believed that alkoxysilacyclic or acyloxysilacyclic compounds, such as, for example, the MESCAP molecule polymerizes to form a structure where at least some of the —O— bridges in the backbone are replaced with a —$CH_2$— methylene or —$CH_2CH_2$— ethylene bridge(s). In films deposited using DEMS as the structure forming precursor where the carbon exists mainly in the form of terminal Si-Me groups there is a relationship between the % Si-Me (directly related to % C) versus mechanical strength where the replacement of a bridging Si—O—Si group with two terminal Si-Me groups decreases the mechanical properties because the network structure is disrupted. In the case of the silicon compounds it is believed that the cyclic structure is broken either during the film deposition or the cure process to form $SiCH_2Si$ or $SiCH_2CH_2Si$ bridging groups. In this manner, one can incorporate carbon in the form of a bridging group so that, in terms of mechanical strength, the network structure is not disrupted by increasing the carbon content in the film. Without intending to be bound by a particular theory, it is believed that this attribute adds carbon to the film, which allows the film to be more resilient to carbon depletion of the porous OSG film from processes such as etching of the film, plasma ashing of photoresist, and $NH_3$ plasma treatment of copper surfaces. Carbon depletion in the OSG films can cause increases in the defective dielectric constant of the film as well as problems with film etching and feature bowing during wet cleaning steps, and/or integration issues when depositing copper diffusion barriers.

In certain embodiments of the method and composition disclosed herein, the structure forming precursor further comprises a hardening additive which will increase the mechanical strength. Examples of hardening additives include tetraalkoxysilanes ($Si(OR^5)$) wherein $R^5$ is selected from the group consisting of a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group, such as for example, tetrethoxysilane (TEOS) or tetramethoxysilane (TMOS). In embodiments wherein a hardening additive is used, the composition of the structure forming portion comprises from about 30 to about 95 weight percent structure forming precursor comprising the silicon compound(s) having Formula I; and from about 5 to about 70 weight percent of hardening additive.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In addition to the structure forming species (i.e., compounds of Formula I), additional materials can be introduced into the reaction chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as oxygen-containing species such as, for example, $O_2$, $O_3$, and $N_2O$, gaseous or liquid organic substances, $NH_3$, $H_2$, $CO_2$, or CO. In one particular embodiment, the reaction mixture introduced into the reaction chamber comprises optionally at least one oxidant selected from the group consisting of $O_2$, $N_2O$, NO, $NO_2$, $CO_2$, water, $H_2O_2$, ozone, and combinations thereof. In an alternative embodiment, the reaction mixture does not comprise an oxidant.

Energy is applied to the gaseous reagents to induce the gases to react and to form the film on the substrate. Such energy can be provided by, e.g., plasma, pulsed plasma, helicon plasma, high density plasma, inductively coupled plasma, remote plasma, hot filament, and thermal (i.e., non-filament) and methods. A secondary rf frequency source can be used to modify the plasma characteristics at the substrate surface. Preferably, the film is formed by plasma enhanced chemical vapor deposition ("PECVD").

The flow rate for each of the gaseous reagents preferably ranges from 10 to 5000 sccm, more preferably from 30 to 1000 sccm, per single 200 mm wafer. The individual rates are selected so as to provide the desired amounts of silicon, carbon, and oxygen in the film. The actual flow rates needed may depend upon wafer size and chamber configuration, and are in no way limited to 200 mm wafers or single wafer chambers.

In some embodiments, the film is deposited at a deposition rate of about 50 nanometers (nm) per minute.

The pressure in the reaction chamber during deposition ranges from about 0.01 to about 600 torr or from about 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein, e.g., a 5 mm outermost edge of the substrate is not included in the statistical calculation of uniformity.

Preferred embodiments disclosed herein provide a thin film material having a low dielectric constant and improved mechanical properties, thermal stability, and chemical resistance (to oxygen, aqueous oxidizing environments, etc.) relative to other porous low k dielectric films deposited using other structure forming precursors known in the art. The structure forming precursors described herein comprising the alky-alkoxysilacyclic compound(s) having Formula I provide a higher incorporation of carbon into the film (preferably predominantly in the form of organic carbon, —$CH_x$, where x is 1 to 3) whereby specific precursor or network-forming chemicals are used to deposit films. In certain embodiments, the majority of the hydrogen in the film is bonded to carbon.

The low k dielectric films deposited according to the compositions and methods described herein comprise: (a) about 10 to about 35 atomic %, more preferably about 20 to about 30 atomic % silicon; (b) about 10 to about 65 atomic %, more preferably about 20 to about 45 atomic % oxygen; (c) about 10 to about 50 atomic %, more preferably about 15 to about 40 atomic % hydrogen; (d) about 5 to about 40 atomic %, more preferably about 10 to about 45 atomic % carbon. Films may also contain about 0.1 to about 15 atomic %, more preferably about 0.5 to about 7.0 atomic % fluorine, to improve one or more of materials properties. Lesser portions of other elements may also be present in certain of the films disclosed herein. OSG materials are considered to be low k materials as their dielectric constant is less than that of the standard material traditionally used in the industry—silica glass.

Total porosity of the film may be from 0 to 15% or greater depending upon the process conditions and the desired final film properties. Films disclosed herein preferably have a density of less than 2.3 g/ml, or alternatively, less than 2.0 g/ml or less than 1.8 g/ml. Total porosity of the OSG film can be influenced by post deposition treatment including exposure to thermal or UV curing, plasma sources. Although the preferred embodiments disclosed herein do not include the addition of a porogen during film deposition, porosity can be induced by post deposition treatment such as UV curing. For example, UV treatment can result in porosity approaching from about 15 to about 20%, with preferably between from about 5 to about 10%.

Films disclosed herein may also contain fluorine, in the form of inorganic fluorine (e.g., Si—F). Fluorine, when present, is preferably contained in an amount ranging from about 0.5 to about 7 atomic %.

Films disclosed herein are thermally stable, with good chemical resistance. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films disclosed herein are suitable for a variety of uses. The films are particularly suitable for deposition on a semiconductor substrate, and are particularly suitable for use as, e.g., an insulation layer, an interlayer dielectric layer and/or an inter-metal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film disclosed herein is an insulation layer, an interlayer dielectric layer, an inter-metal dielectric layer, a capping layer, a chemical-mechanical planarization (CMP) or etch stop layer, a barrier layer or an adhesion layer in an integrated circuit.

Compositions disclosed herein can be provided in any form capable of being deposited by CVD, such as coatings, multi-laminar assemblies, and other types of objects that are not necessarily planar or thin, and a multitude of objects not necessarily used in integrated circuits. Preferably, the substrate is a semiconductor.

In addition to the inventive OSG products, the present disclosure includes the process by which the products are made, methods of using the products and compounds and compositions useful for preparing the products. For example, a process for making an integrated circuit on a semiconductor device is disclosed in U.S. Pat. No. 6,583,049, which is herein incorporated by reference.

Compositions disclosed herein can further comprise, e.g., at least one pressurizable vessel (preferably of stainless steel) fitted with the proper valves and fittings to allow the delivery of hardening additive and the silicon precursor having Formula I such as DESCAP to the process reactor. The contents of the vessel(s) can be premixed. Alternatively, for example hardening additive and precursor can be maintained in separate vessels or in a single vessel having separation means for maintaining the hardening additive and precursor separate during storage. Such vessels can also have means for mixing the hardening additive and precursor when desired.

The preliminary (or as-deposited) film can be further treated by a curing step, i.e., applying an additional energy source to the film, which can comprise thermal annealing, chemical treatment, in-situ or remote plasma treating, photocuring (e.g., UV) and/or microwaving. Other in-situ or post-deposition treatments may be used to enhance material properties like hardness, stability (to shrinkage, to air exposure, to etching, to wet etching, etc.), integrity, uniformity and adhesion. Thus, the term "post-treating" as used herein denotes treating the film with energy (e.g., thermal, plasma, photon, electron, microwave, etc.) or, in some embodiments, chemicals to enhance material properties.

The conditions under which post-treating are conducted can vary greatly. For example, post-treating can be conducted under high pressure or under a vacuum ambient.

UV annealing is a preferred method of curing and is typically conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total UV annealing time is preferably from 0.01 min to 12 hours.

Chemical treatment of the OSG film is conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably from about ambient to about 500° C. The pressure is preferably 10 mtorr to atmospheric pressure. The total curing time is preferably 0.01 min to 12 hours.

UV curing for chemical cross-linking of organosilicate film is typically conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably from about ambient to about 500° C. The power is preferably from 0 to about 5000 W. The wavelength is preferably IR, visible, UV or deep UV (wavelengths<200 nm). The total UV curing time is preferably 0.01 min to 12 hours.

Microwave post-treatment of organosilicate film is typically conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably from about ambient to about 500° C. The power and wavelengths are varied and tunable to specific bonds. The total curing time is preferably from 0.01 min to 12 hours.

Electron beam post-treatment for improvement of film properties is typically conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132, 814 A1. The use of electron beam treatment may provide for enhancement of film mechanical properties through bond-formation processes in matrix.

The methods and compositions disclosed herein will be illustrated in more detail with reference to the following Examples, but it should be understood that the it is not deemed to be limited thereto.

EXAMPLES

Exemplary films or 200 mm wafer processing were formed via a plasma enhanced CVD (PECVD) process using an Applied Materials Precision-5000 system in a 200 mm DxZ or DxL reaction chamber or vacuum chamber that was fitted with an Advance Energy 200 RF generator from a variety of different chemical precursors and process conditions. The PECVD process generally involved the following basic steps: initial set-up and stabilization of gas flows, deposition of the film onto the silicon wafer substrate, and purge/evacuation of chamber prior to substrate removal. After the deposition, some of the films were subjected to UV annealing. UV annealing was performed using a Fusion UV system with a broad band UV bulb, with the wafer held under a helium gas flow at one or more pressures below <10 torr and at one or more temperatures<400° C. The experiments were conducted on p-type Si wafers (resistivity range=8-12 Ohm-cm).

Thickness and refractive index were measured on an SCI FilmTek 2000 Reflectometer. Dielectric constants were determined using Hg probe technique on mid-resistivity p-type wafers (range 8-12 ohm-cm). In Example 1 and Example 2 mechanical properties were determined using MTS Nano Indenter.

Example 1: Deposition of OSG Films from 1,1-Diethyoxy-1-silacyclopentane (DESCP) without Subsequent UV Curing An OSG layer of the structure forming diethoxysilacyclopentane was deposited using the following process conditions for 200 mm processing. The precursor was delivered to the reaction chamber via direct liquid injection (DLI) at a flow rate of 1400 milligrams/minute (mg/min) 200 standard cubic centimeters (sccm) Helium carrier gas flow, 10 sccm $O_2$, 350 milli-inch showerhead/wafer spacing, 400° C. wafer chuck temperature, 7 Torr chamber pressure to which a 600 W plasma was applied. The resulting as deposited film contained a dielectric constant (k) of 2.88, hardness (H) of 2.1 GPa, elastic modulus (M) of 12.7 GPa and Refractive Index (RI) of 1.435.

Example 2: Deposition of OSG Films from 1,1-Diethyoxy-1-silacyclopentane (DESCP) Followed by Subsequent UV Curing An OSG layer of the structure forming 1,1-Diethoxysilacyclopentane was deposited using the following process conditions for 200 mm processing. The precursor was delivered to the reaction chamber via direct liquid injection (DLI) at a flow rate of 1400 milligrams/minute (mg/min) 200 standard cubic centimeters (sccm) Helium carrier gas flow, 10 sccm $O_2$, 350 milli-inch showerhead/wafer spacing, 400° C. wafer chuck temperature, 7 Torr chamber pressure to which a 600 W plasma was applied. After deposition, the film was UV annealed for 8 minutes under vacuum. After UV curing the k was 2.96, hardness (H) of 3.1 GPa, elastic modulus (M) of 18.3 GPa and RI of 1.436. This example demonstrated a significant improvement in mechanical strength with a minimal increase in k.

Example 3: Deposition of OSG Films from 1,1-Dimethyoxy-1-silacyclopentane (DMSCP) without Subsequent UV Curing An OSG layer of the structure forming dimethoxysilacyclopentane was deposited using the following process conditions for 200 mm processing. The precursor was delivered to the reaction chamber via direct liquid injection (DLI) at a flow rate of 1400 milligrams/minute (mg/min) 200 standard cubic centimeters (sccm) Helium carrier gas flow, 20 sccm $O_2$, 350 milli-inch showerhead/wafer spacing, 400° C. wafer chuck temperature, 8 Torr chamber pressure to which a 600 W plasma was applied. The resulting as deposited film contained a dielectric constant (k) of 3.0, hardness (H) of 1.9 GPa, elastic modulus (M) of 12.3 GPa and Refractive Index (RI) of 1.436.

Example 4: Deposition of OSG Films from 1,1-Dimethyoxy-1-silacyclopentane (DMSCP) Followed by Subsequent UV Curing A OSG layer of the structure forming 1,1-Dimethoxysilacyclopentane was deposited using the following process conditions for 200 mm processing. The precursor was delivered to the reaction chamber via direct liquid injection (DLI) at a flow rate of 1400 milligrams/minute (mg/min) 200 standard cubic centimeters (sccm) Helium carrier gas flow, 20 sccm $O_2$, 350 milli-inch showerhead/wafer spacing, 400° C. wafer chuck temperature, 8 Torr chamber pressure to which a 600 W plasma was applied. After deposition the film was UV annealed for 8 minutes under vacuum. After UV curing the k was 3.1, hardness (H) of 3.0 GPa, elastic modulus (M) of 18.8 GPa and RI of 1.45. This example demonstrated a significant improvement in mechanical strength with a minimal increase in k.

Example 5: Deposition of OSG Films from 1,1-Diethyoxy-1-silacyclobuntane (DESCB) without Subsequent UV Curing A OSG layer of the structure forming diethoxysilacyclobuntane was deposited using the following process conditions for 200 mm processing. The precursor was delivered to the reaction chamber via direct liquid injection (DLI) at a flow rate of 2000 milligrams/minute (mg/min) 200 standard cubic centimeters (sccm) Helium carrier gas flow, 10 sccm $O_2$, 350 milli-inch showerhead/wafer spacing, 400° C. wafer chuck temperature, 7 Torr chamber pressure to which a 750 W plasma was applied. The resulting as deposited film contained a dielectric constant (k) of 3.02, hardness (H) of 2.6 GPa, elastic modulus (M) of 17.5 GPa and Refractive Index (RI) of 1.37.

Example 6: Deposition of OSG Films from 1,1-Diethyoxy-1-silacyclobuntane (DESCB) Followed by Subsequent UV Curing A OSG layer of the structure forming 1,1-Diethoxysilacyclobuntane was deposited using the following process conditions for 200 mm processing. The precursor was delivered to the reaction chamber via direct liquid injection (DLI) at a flow rate of 2000 milligrams/minute (mg/min) 200 standard cubic centimeters (sccm) Helium carrier gas flow, 10 sccm $O_2$, 350 milli-inch showerhead/wafer spacing, 400° C. wafer chuck temperature, 7 Torr chamber pressure to which a 750 W plasma was applied. After deposition the film was UV annealed for 8 minutes under vacuum. After UV curing the k was 3.07, hardness (H) of 3.2 GPa, elastic modulus (M) of 22.8 GPa and RI of 1.39. This example demonstrated a significant improvement in mechanical strength with a minimal increase in k.

Comparative Example 1: Deposition of OSG Films from 1-Methyl-1-Ethoxy-1-silacyclopentane (MESCAP) without Subsequent UV Curing A composite layer of the structure forming 1-Methyl-1-Ethoxy-1-silacyclopentane was deposited using the following process conditions in a DxZ chamber for 200 mm processing. The precursors were delivered to the reaction chamber via direct liquid injection (DLI) at a flow rate of 1500 milligrams/minute (mg/min) 200 standard cubic centimeters (sccm) helium carrier gas flow, 10 sccm $O_2$, 350 milli-inch showerhead/wafer spacing, 400° C. wafer chuck temperature, 7 Torr chamber pressure to which a 600 W plasma was applied. The resulting as-deposited film contained a dielectric constant (k) of 3.03, hardness (H) of 2.69 GPa, elastic modulus (M) of 10.3 GPa and Refractive Index (RI) of 1.50.

Comparative Example 2: Deposition of OSG Films from 1-Methyl-1-Ethoxy-1-silacyclopentane (MESCAP) with Subsequent UV Curing A composite layer of the structure forming 1-Methyl-1-Ethoxy-1-silacyclopentane was deposited using the following process conditions in a DxZ chamber for 200 mm processing. The precursors were delivered to the reaction chamber via direct liquid injection (DLI) at a flow rate of 1000 milligrams/minute (mg/min) 200 standard cubic centimeters (sccm) helium carrier gas flow, 10 sccm $O_2$, 350 milli-inch showerhead/wafer spacing, 400° C. wafer chuck temperature, 7 Torr chamber pressure to which a 400 W plasma was applied. The resulting as-deposited film contained a dielectric constant (k) of 3.01, hardness (H) of 2.06 GPa, elastic modulus (M) of 19.9 GPa, and Refractive Index (RI) of 1.454. After UV curing the k was 3.05, H of 3.58 GPa and RI of 1.46. This example demonstrated a significant improvement in mechanical strength with a minimal increase in k.

Although illustrated and described above with reference to certain specific embodiments and examples, embodiments disclosed herein are nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges.

The invention claimed is:

1. A chemical vapor deposition method for producing a dielectric film, the method comprising:
   providing a substrate into a reaction chamber;
   introducing gaseous reagents into the reaction chamber wherein the gaseous reagents comprise a silicon precursor comprising a silicon compound having the following Formula I:

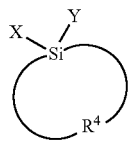

(I)

wherein X and Y are independently selected from the group consisting of $OR^1$, $OR^2$, and $OC(O)R^3$; $R^{1-3}$ are independently selected from the group consisting of a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ heterocyclic alkyl group, a $C_5$ to $C_{10}$ aryl group, and a $C_3$ to $C_{10}$ hetero-aryl group; and $R^4$ is a $C_3$ to $C_5$ alkyl di-radical which forms a four-membered, five-membered, or six-membered saturated cyclic ring with the Si atom, optionally at least one oxygen source, and optionally a hardening additive, wherein the gaseous reagents do not include a porogen; and
   applying energy to the gaseous reagents in the reaction chamber to induce reaction of the gaseous reagents to deposit a film on the substrate.

2. The method of claim 1 wherein the silicon compound comprises at least one selected from the group consisting of 1,1-dimethoxy-1-silacyclopentane, 1,1-diethoxy-1-silacyclopentane, 1,1-di-n-propyloxy-1-silacyclopentane, 1,1-di-iso-propyloxy-1-silacyclopentane, 1,1-dimethoxy-1-silacyclobutane, 1,1-diethoxy-1-silacyclobutane, 1,1-di-n-propyloxy-1-silacyclobutane, 1,1-di-iso-propyloxy-1-silacyclobutane, 1,1-dimethoxy-1-silacyclohexane, 1,1-di-iso-propyloxy-1-silacyclohexane, 1,1-di-n-propyloxy-1-silacyclohexane, 1-methoxy-1-acetoxy-1-silacyclopentane, 1,1-diacetoxy-1-silacyclopentane, 1-methoxy-1-acetoxy-1-silacyclobutane, 1,1-diacetoxy-1-silacyclobutane, 1-methoxy-1-acetoxy-1-silacyclohexane, 1,1-diacetoxy-1-silacyclohexane, 1-ethoxy-1-acetoxy-1-silacyclopentane, 1-ethoxy-1-acetoxy-1-silacyclobutane, and combinations thereof.

3. The method of claim 1 wherein the hardening additive comprises tetraethoxysilane.

4. The method of claim 1 wherein the hardening additive comprises tetramethoxysilane.

5. The method of claim 1 which is a plasma enhanced chemical vapor deposition method.

6. The method of claim 1 where the optionally at least one oxygen source is selected from the group consisting of $O_2$, $N_2O$, NO, $NO_2$, $CO_2$, water, $H_2O_2$, and ozone.

7. The method of claim 1 where the reaction chamber in the applying step comprises at least one gas selected from the group consisting of He, Ar, $N_2$, Kr, Xe, $NH_3$, $H_2$, $CO_2$, or CO.

8. The method of claim 1 further comprising a step of applying additional energy to the film.

9. The method of claim 8 wherein the additional energy is at least one selected from the group consisting of a thermal treatment, an ultraviolet (UV) treatment, an electron beam treatment, and a gamma radiation treatment.

10. The method of claim 9 wherein the UV treatment occurs during at least a portion of the thermal treatment.

11. The method of claim 1 wherein the silicon compound included in the gaseous reagents includes less than 100 ppm of any halide ion impurities.

12. The method of claim 1 wherein the silicon compound included in the gaseous reagents includes less than 5 ppm of any metal ion impurities.

13. A chemical vapor deposition method for producing a porous dielectric film, comprising:
    providing a substrate into a reaction chamber;
    introducing gaseous reagents into the reaction chamber wherein the gaseous reagents comprise a silicon precursor comprising a silicon compound having the following Formula I:

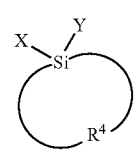

(I)

wherein X and Y are independently selected from the group consisting of $OR^1$, $OR^2$, and $OC(O)R^3$; $R^{1-3}$ are independently selected from the group consisting of a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ heterocyclic alkyl group, a $C_5$ to $C_{10}$ aryl group, and a $C_3$ to $C_{10}$ hetero-aryl group; and $R^4$ is a $C_3$ to $C_5$ alkyl di-radical which forms a four-membered, five-membered, or six-membered saturated cyclic ring with the Si atom, and further optionally comprise at least one oxygen source, wherein the gaseous reagents do not include a porogen; and
    applying energy to the gaseous reagents in the reaction chamber to induce reaction of the gaseous reagents to deposit a film on the substrate.

14. The method of claim 13 wherein the optional oxygen source is at least one selected from the group consisting of $O_2$, $N_2O$, NO, $NO_2$, $CO_2$, water, $H_2O_2$, and ozone.

15. The method of claim 13 wherein the silicon compound comprises at least one selected from the group consisting of 1,1-dimethoxy-1-silacyclopentane, 1,1-diethoxy-1-silacyclopentane, 1,1-di-n-propyloxy-1-silacyclopentane, 1,1-di-iso-propyloxy-1-silacyclopentane, 1,1-dimethoxy-1-silacyclobutane, 1,1-diethoxy-1-silacyclobutane, 1,1-di-n-propyloxy-1-silacyclobutane, 1,1-di-iso-propyloxy-1-silacyclobutane, 1,1-dimethoxy-1-silacyclohexane, 1,1-di-iso-propyloxy-1-silacyclohexane, 1,1-di-n-propyloxy-1-silacyclohexane, 1-methoxy-1-acetoxy-1-silacyclopentane, 1,1-diacetoxy-1-silacyclopentane, 1-methoxy-1-acetoxy-1-silacyclobutane, 1,1-diacetoxy-1-silacyclobutane, 1-methoxy-1-acetoxy-1-silacyclohexane, 1,1-diacetoxy-1-silacyclohexane, 1-ethoxy-1-acetoxy-1-silacyclopentane, 1-ethoxy-1-acetoxy-1-silacyclobutane, and combinations thereof.

16. The method of claim 13 wherein the silicon precursor included in the gaseous reagents includes less than 100 ppm of any halide ion impurities.

17. The method of claim 13 wherein the silicon precursor included in the gaseous reagents includes less than 5 ppm of any metal ion impurities.

* * * * *